United States Patent
Tsai et al.

(10) Patent No.: US 11,736,037 B2
(45) Date of Patent: Aug. 22, 2023

(54) MEMS STRUCTURE AND METHOD OF FORMING SAME

(71) Applicant: Taiwan Semiconductor Manufacturing Company, Ltd., Hsinchu (TW)

(72) Inventors: Yi Heng Tsai, Hsinchu (TW); Chia-Hua Chu, Zhubei (TW); Kuei-Sung Chang, Kaohsiung (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 581 days.

(21) Appl. No.: 16/668,660

(22) Filed: Oct. 30, 2019

(65) Prior Publication Data

US 2020/0067425 A1 Feb. 27, 2020

Related U.S. Application Data

(60) Continuation of application No. 15/859,130, filed on Dec. 29, 2017, now Pat. No. 10,541,627, which is a division of application No. 14/745,696, filed on Jun. 22, 2015, now Pat. No. 9,859,819, which is a division of application No. 13/219,927, filed on Aug. 29, 2011, now Pat. No. 9,065,358.

(Continued)

(51) Int. Cl.
| | |
|---|---|
| *G01P 15/125* | (2006.01) |
| *G01P 15/00* | (2006.01) |
| *H02N 1/00* | (2006.01) |
| *B81B 3/00* | (2006.01) |
| *G01P 15/08* | (2006.01) |

(52) U.S. Cl.
CPC ............ *H02N 1/006* (2013.01); *B81B 3/001* (2013.01); *B81B 3/0005* (2013.01); *B81B 3/0008* (2013.01); *G01P 15/125* (2013.01); *H02N 1/00* (2013.01); *B81B 2201/0235* (2013.01); *G01P 2015/0871* (2013.01); *Y10T 29/49002* (2015.01)

(58) Field of Classification Search
None
See application file for complete search history.

(56) References Cited

U.S. PATENT DOCUMENTS

| | | | |
|---|---|---|---|
| 3,525,255 A | 8/1970 | Orr | |
| 5,174,884 A * | 12/1992 | Shimada | ................. G01P 21/00 204/426 |

(Continued)

FOREIGN PATENT DOCUMENTS

| | | | | |
|---|---|---|---|---|
| DE | 19651269 A1 * | 12/1997 | ......... | B81C 1/00246 |
| DE | 19906046 A1 * | 8/1999 | ........... | B81B 3/0051 |

(Continued)

*Primary Examiner* — Jill E Culler
*Assistant Examiner* — Ruben C Parco, Jr.
(74) *Attorney, Agent, or Firm* — Slater Matsil, LLP

(57) ABSTRACT

A microelectromechanical system (MEMS) device includes a substrate and a movable element at least partially suspended above the substrate and having at least one degree of freedom. The MEMS device further includes a protrusion extending from the substrate and configured to contact the movable element when the movable element moves in the at least one degree of freedom, wherein the protrusion comprises a surface having a water contact angle of higher than about 15° measured in air.

20 Claims, 20 Drawing Sheets

Related U.S. Application Data

(60) Provisional application No. 61/506,526, filed on Jul. 11, 2011.

(56) References Cited

U.S. PATENT DOCUMENTS

| | | | |
|---|---|---|---|
| 5,662,771 A * | 9/1997 | Stouppe | B81C 1/0096 438/666 |
| 6,777,263 B1 | 8/2004 | Gan et al. | |
| 6,938,485 B2 | 9/2005 | Kuisma et al. | |
| 7,142,349 B2 | 11/2006 | Yang | |
| 7,275,424 B2 | 10/2007 | Felton et al. | |
| 7,382,513 B2 | 6/2008 | Yang | |
| 7,696,004 B2 | 4/2010 | Yuan et al. | |
| 7,736,931 B1 | 6/2010 | Guo | |
| 8,186,221 B2 | 5/2012 | Lin et al. | |
| 8,466,606 B2 | 6/2013 | Chen et al. | |
| 8,497,557 B2 | 7/2013 | Tanaka et al. | |
| 8,507,306 B2 | 8/2013 | Chen et al. | |
| 9,859,819 B2 | 1/2018 | Tsai et al. | |
| 2005/0012975 A1 * | 1/2005 | George | G02B 26/0866 438/48 |
| 2007/0091414 A1 * | 4/2007 | Yang | G02B 26/0841 359/291 |
| 2007/0206266 A1 * | 9/2007 | Novotny | G02B 26/0841 359/291 |
| 2009/0080059 A1 * | 3/2009 | Sugimoto | G02B 26/0841 359/290 |
| 2010/0058865 A1 | 3/2010 | Zhang et al. | |
| 2011/0154905 A1 | 6/2011 | Hsu et al. | |
| 2011/0157010 A1 | 6/2011 | Kothari et al. | |
| 2011/0187227 A1 | 8/2011 | Chen et al. | |
| 2011/0221455 A1 | 9/2011 | Feyh | |
| 2013/0015743 A1 | 1/2013 | Tsai et al. | |
| 2013/0181355 A1 | 7/2013 | Tsai et al. | |

FOREIGN PATENT DOCUMENTS

| | | | | |
|---|---|---|---|---|
| DE | 10223359 A1 | * | 12/2003 | B05D 1/62 |
| JP | 2004006310 A | * | 1/2004 | H01H 59/0009 |
| KR | 20110013520 A | * | 2/2011 | |

* cited by examiner

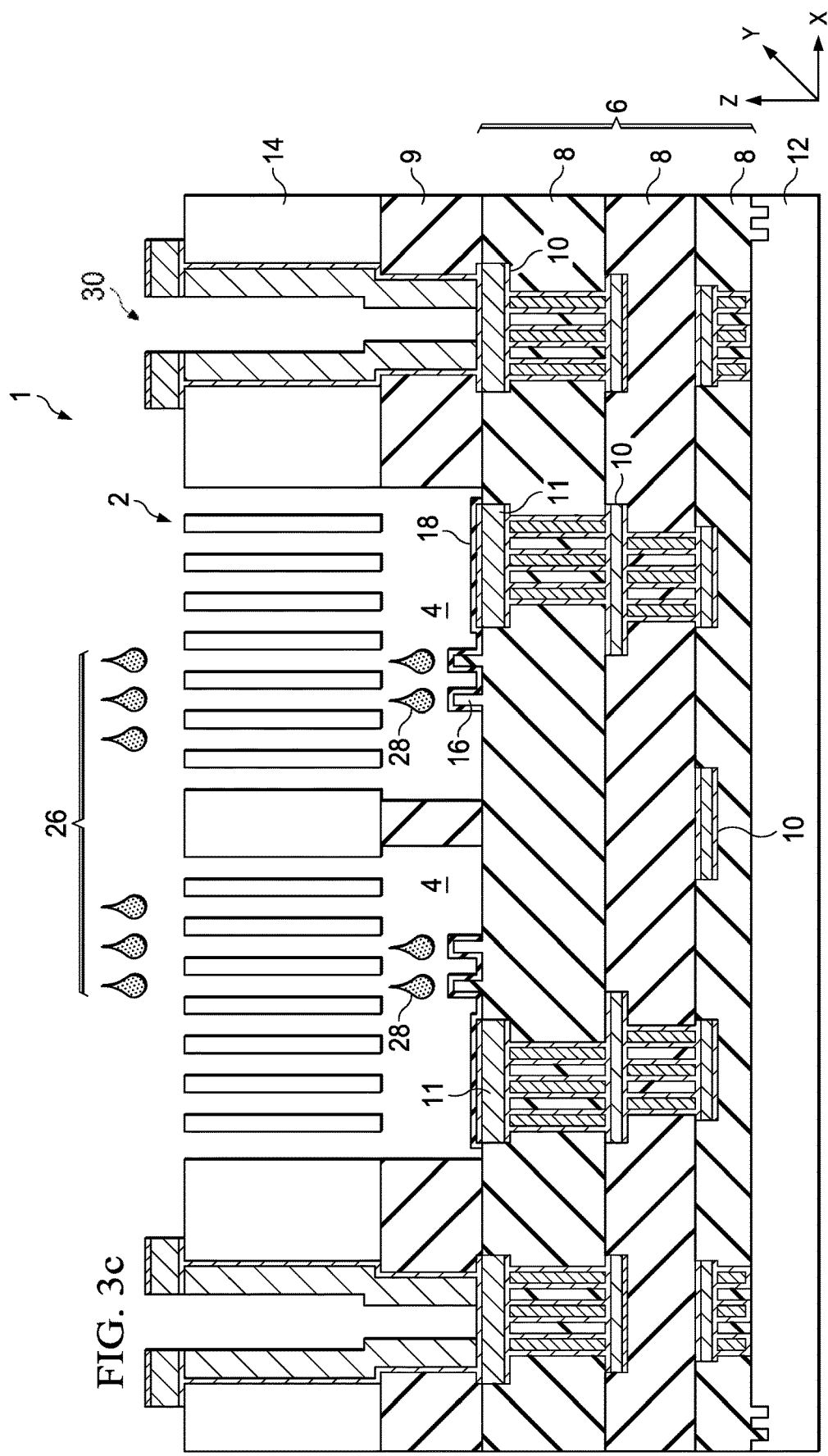

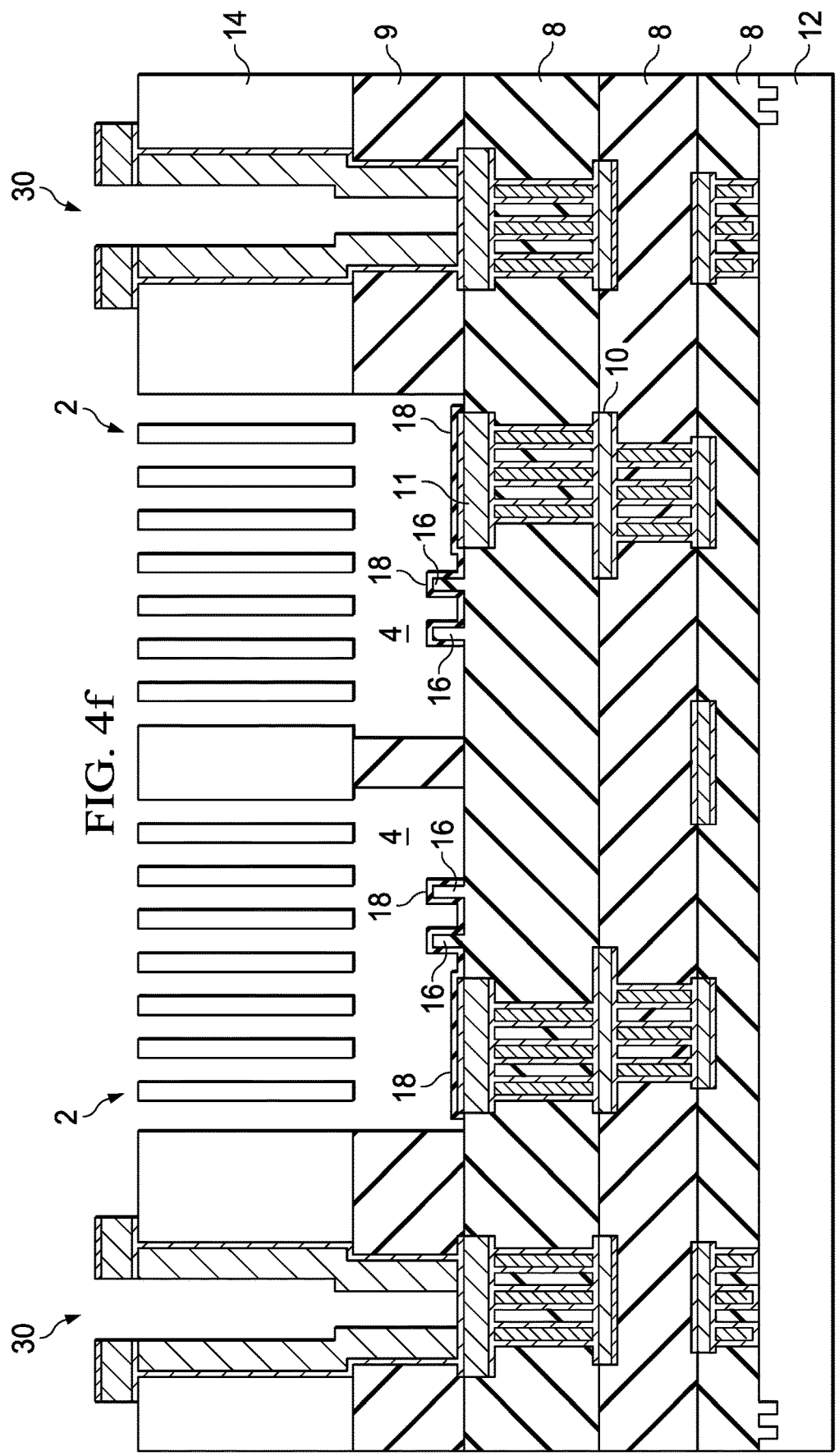

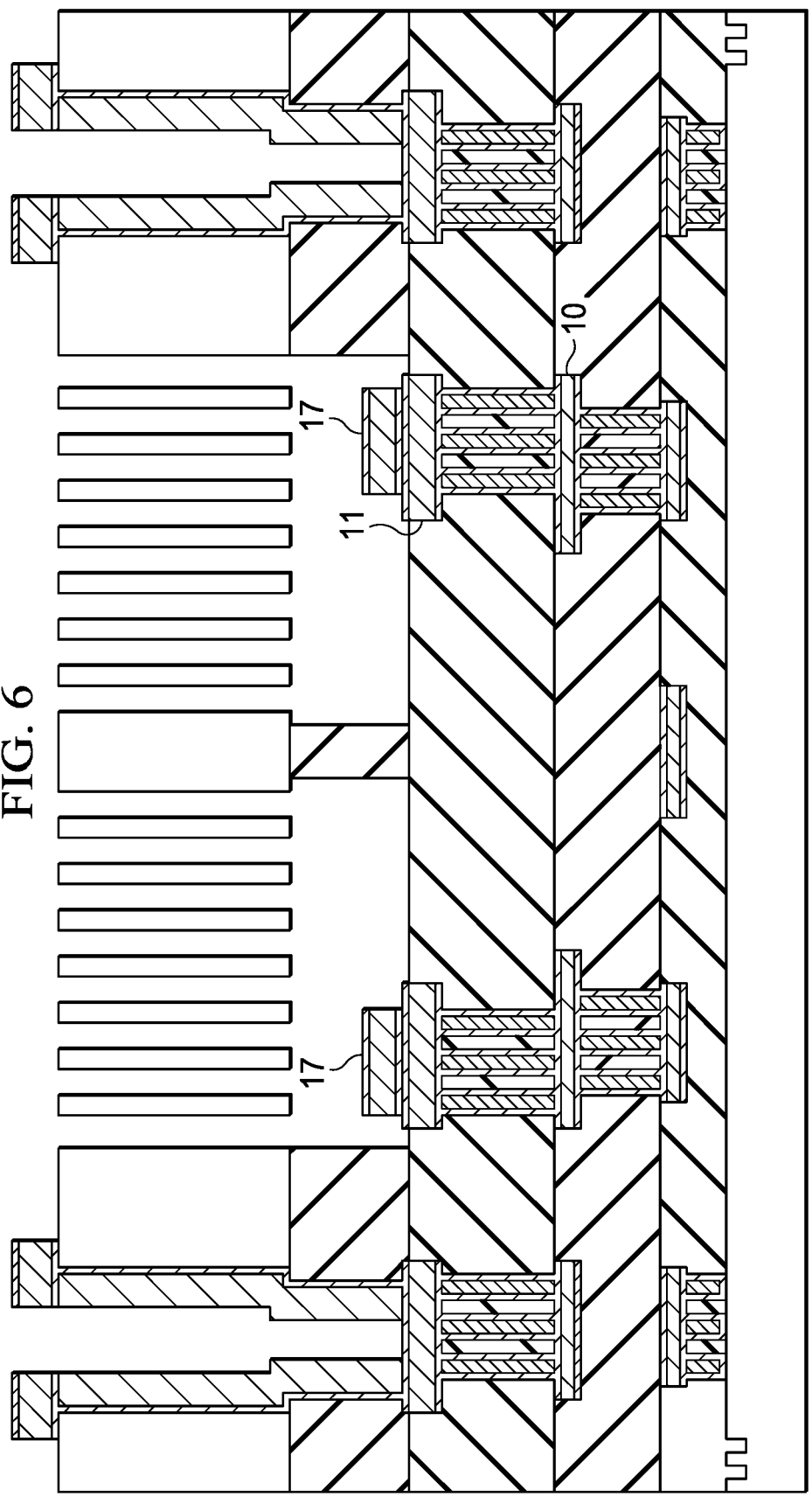

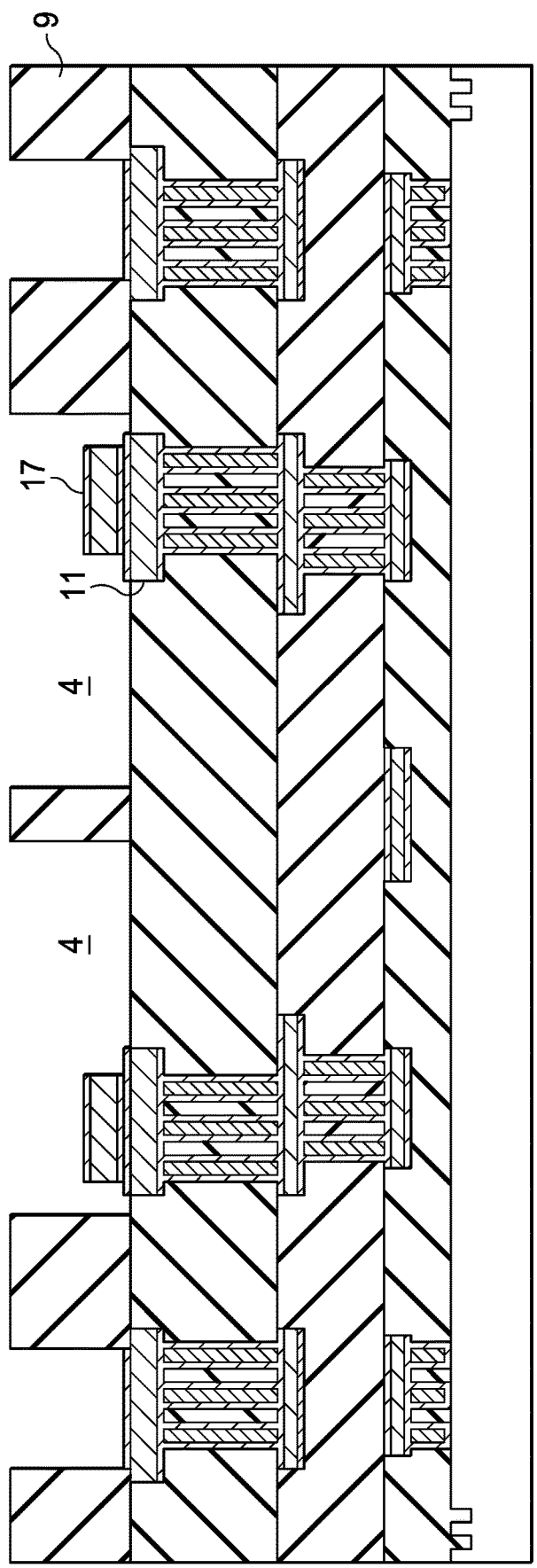

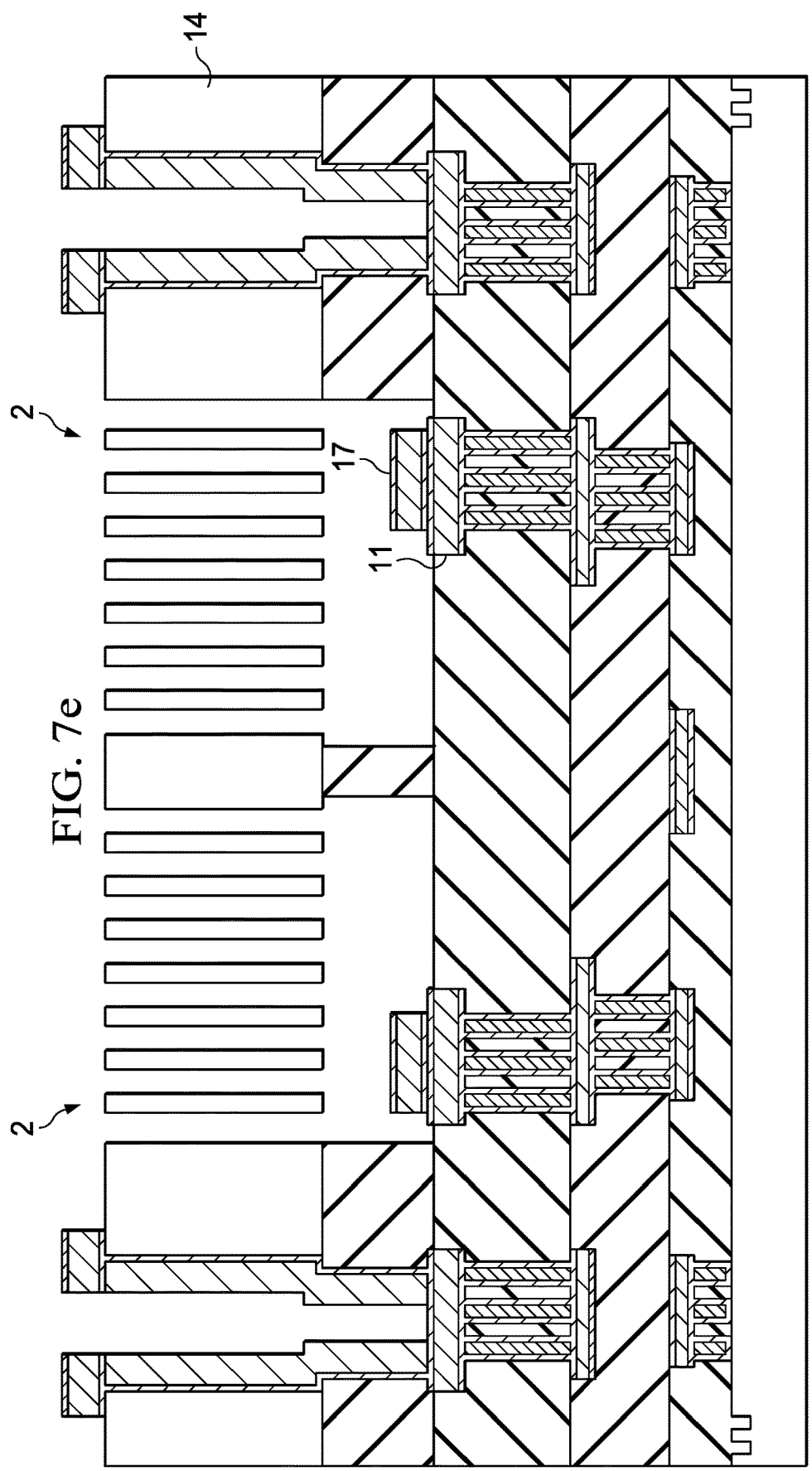

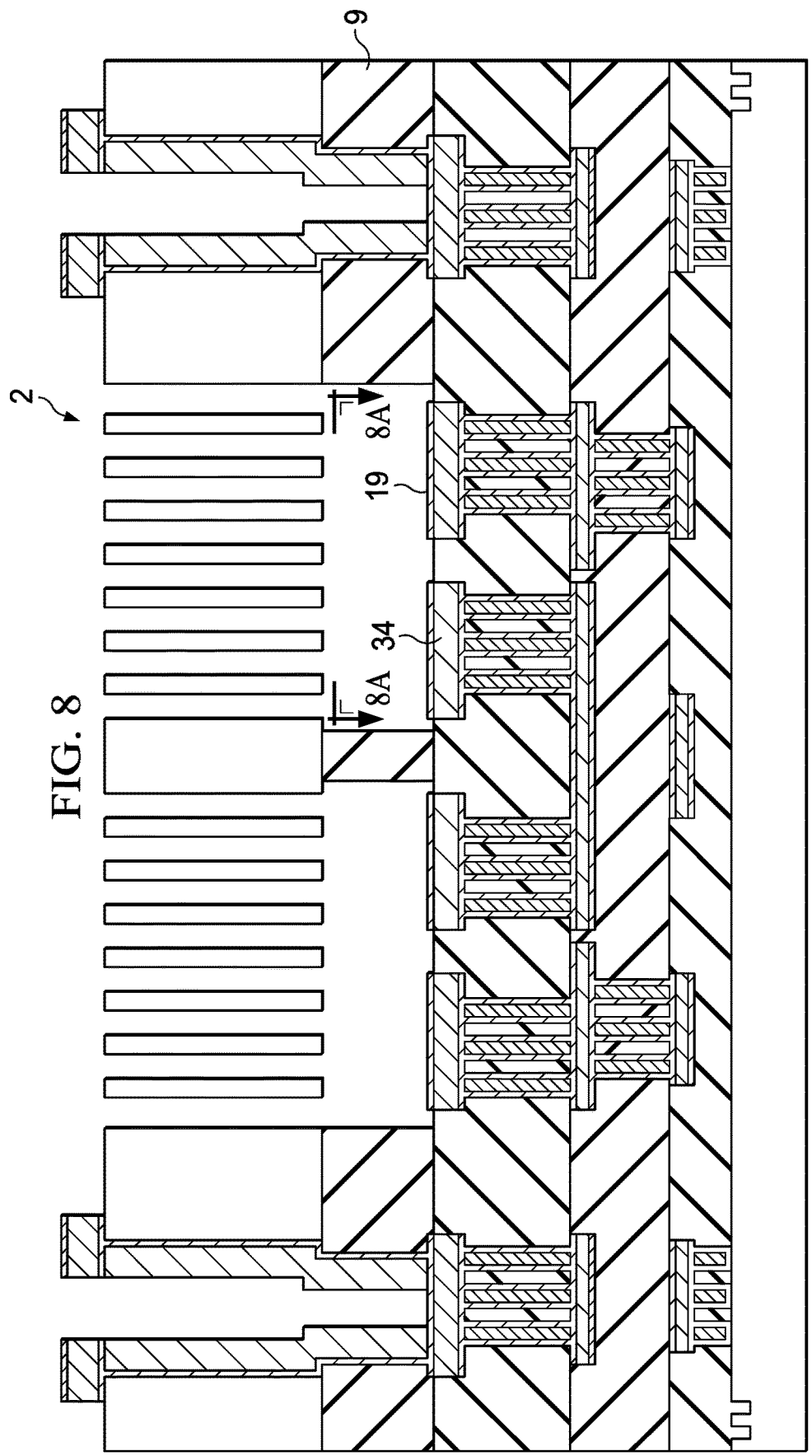

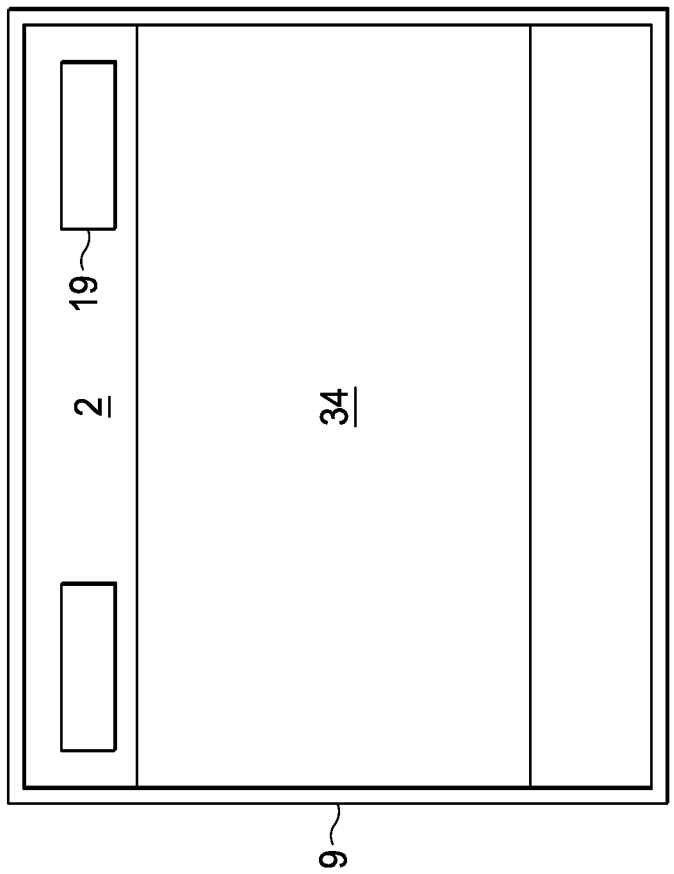

MEMS STRUCTURE AND METHOD OF FORMING SAME

PRIORITY CLAIM AND CROSS-REFERENCE

This application is a continuation of U.S. patent application Ser. No. 15/859,130, filed on Dec. 29, 2017 and entitled "MEMS Structure and Method of Forming Same" which application is a divisional of U.S. patent application Ser. No. 14/745,696, filed on Jun. 22, 2015 and entitled "MEMS Structure and Method of Forming Same," now U.S. Pat. No. 9,859,819, which application is a divisional of U.S. patent application Ser. No. 13/219,927, filed Aug. 29, 2011, entitled "MEMS Structure and Method of Forming Same," now U.S. Pat. No. 9,065,358 issued on Jun. 23, 2015, which application claims the benefit of U.S. Provisional Application No. 61/506,526, filed on Jul. 11, 2011, entitled "MEMS Structure and Method of Forming Same," which applications are hereby incorporated herein by reference in their entirety.

BACKGROUND

Microelectromechanical systems (MEMS) come in a variety of forms and are used for a host of different applications. Many MEMS include a movable element, such as a flexible membrane (e.g., in a deformable mirror device), a cantilevered beam (e.g., in a motion sensor), a series of fingers in a comb structure (e.g., in an accelerometer), and the like. MEMS frequently suffer from the phenomenon known as stiction. Stiction, which is derived from the words static and friction, refers to the undesirable consequence of a movable element in a MEMS device contacting and becoming stuck to a surrounding feature.

The phenomenon of stiction can arise during operation of the MEMS device and/or during manufacture of the device. Various environmental factors and processes that take place during the manufacture of a MEMS device can give rise to stiction. Wet processes, such as photoresist strips, water rinses, solvent cleans, and the like and dry processes such as plasma etch and plasma clean steps, in particular, can create circumstances wherein friction is likely to occur. This phenomenon can impede or even prevent the proper operation of the MEMS device.

What is needed, then, is a MEMS structure that can overcome the above described shortcomings in the prior art.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3a through 3c schematically illustrate forces acting upon a MEMS structure during manufacturing steps;

FIGS. 4a through 4f illustrate steps in the manufacture of an illustrative embodiment MEMS device;

FIG. 6 illustrates yet another embodiment MEMS device;

FIGS. 7a through 7e illustrate steps in the manufacture of the MEMS device illustrated in FIG. 6; and FIGS. 8 and 8a illustrate still another illustrative embodiment MEMS device.

DETAILED DESCRIPTION OF ILLUSTRATIVE EMBODIMENTS

Figure 1A:
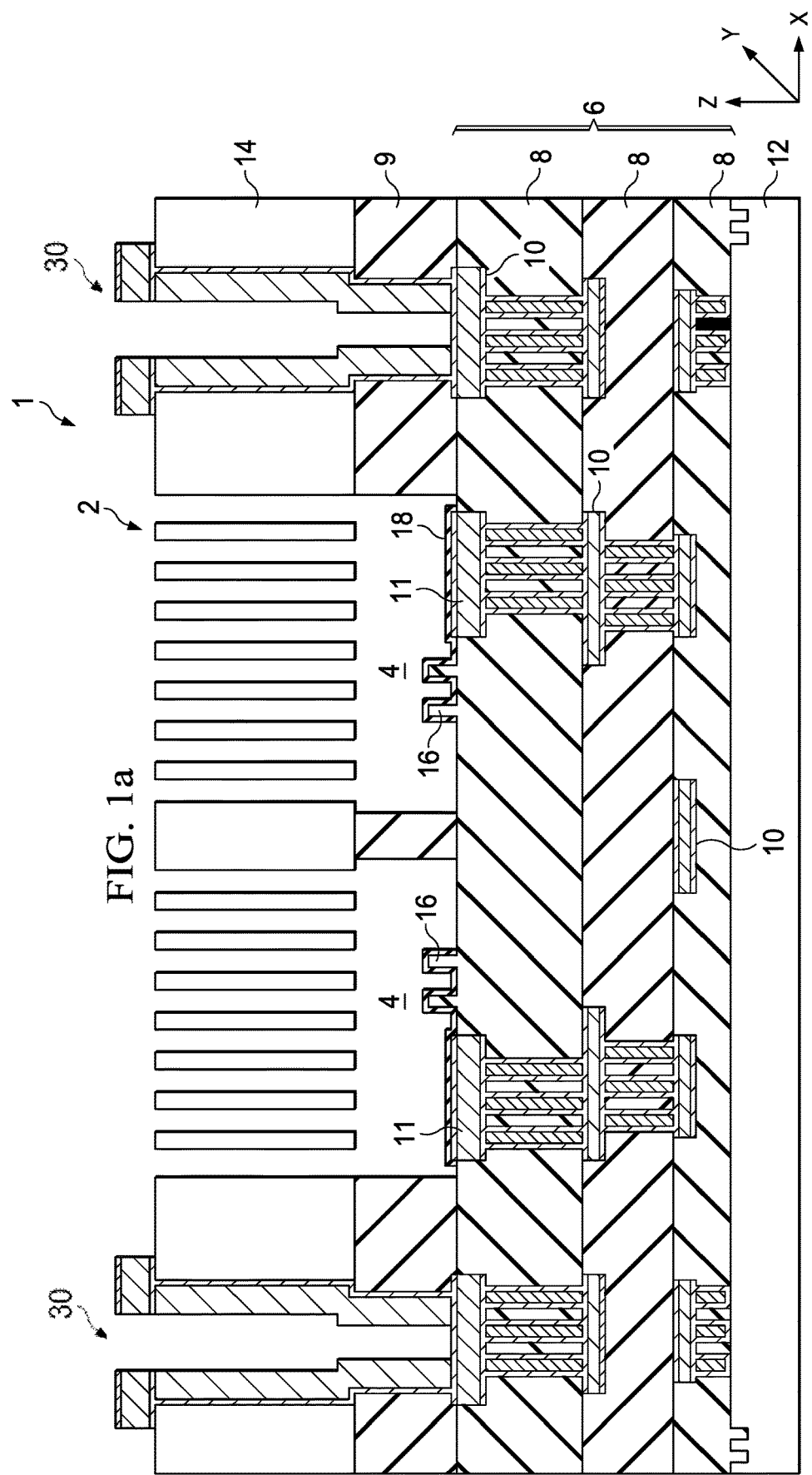
FIG. 1a illustrates in cross-sectional view an illustrative embodiment of a MEMS device and FIG. 1b illustrates the same MEMS device in plan view.
Figure 1B:
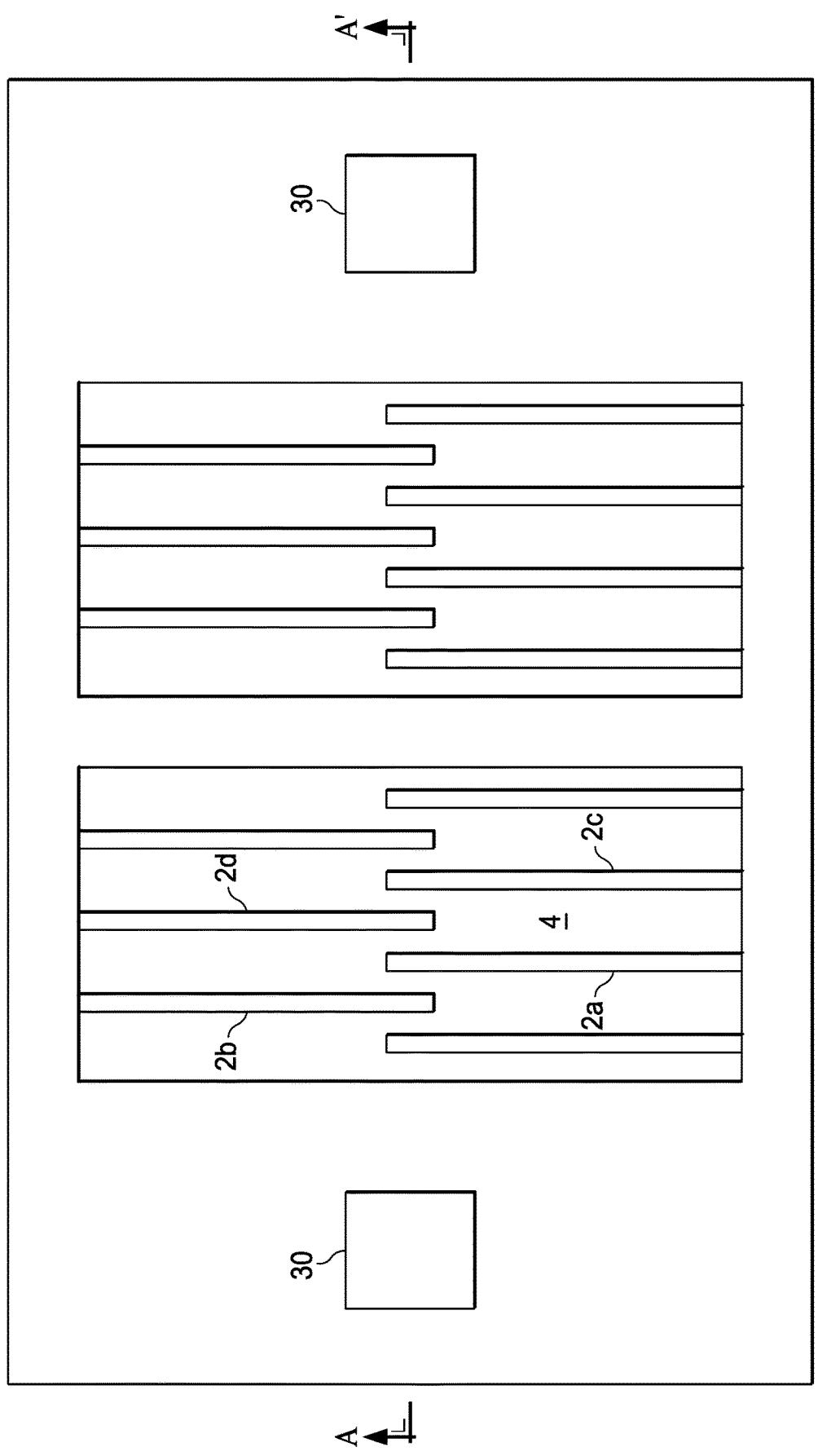

A first illustrative embodiment MEMS device 1 is illustrated in FIG. 1a. MEMS device includes at least one movable element 2 at least partially suspended above a cavity 4 formed in a substrate 6. FIG. 1a is a cross-sectional view of MEMS device 1. For reference, FIG. 1b illustrates a plan view of MEMS 1 wherein FIG. 1a is taken across the line indicated by A-A' in FIG. 1b. As best illustrated by FIG. 1b, MEMS device 2 comprises a series on interdigitated fingers, 2a, 2b, 2c, 2d, etc., each of which is fixed at one end and is free at the other end. The free ends of the interdigitated fingers extend over, in other words are cantilevered over, cavity 4 formed in substrate 6. The size, number, and placement of the interdigitated fingers 2a, 2b, 2c, 2d, etc., are for illustration and any number size and placement of interdigitated fingers is contemplated within the present disclosure. As will be addressed in more detail below, movable elements 2 may be formed by patterning a wafer 14 into the desired patterns. The MEMS device 1 illustrated in FIGS. 1a and 1b is commonly referred to as a comb structure. In other embodiments, MEMS device 1 can take the form of a single cantilevered beam extending over a cavity, a flexible membrane suspended over a substrate or a cavity in a substrate, or any other well known alternatives.

One skilled in the art will recognize that substrate 6 comprises a stack of dielectric layers 8 formed atop a wafer 12. Embedded within the stack of dielectric layers are various metal interconnect features 10. Dielectric layers 8 and metal interconnects 10 are formed using known back-end-of-line (BEOL) techniques common to the semiconductor industry and are not repeated herein. As illustrated, three layers of metal interconnects are embedded within three dielectric layers, although other numbers of layers and arrangements are also within the contemplated scope of this disclosure.

Wafer 12 may comprises a bulk silicon wafer. In other embodiments, wafer 12 may comprise any semiconductor substrate, ceramic substrate, quartz substrate, or the like. In some embodiments, wafer 12 comprises a silicon-on-insulator (SOI) or other composite wafer. Active and passive components, such as transistors, diodes, resistors and the like (not shown) may be formed in and on substrate 12.

In the embodiment illustrated in FIG. 1a, a top dielectric layer 9 is formed above the top dielectric layer 8 and atop the top metal layer 10, using well known processing techniques. This top dielectric layer may be silicon oxide, although other dielectrics such as silicon oxynitride, silicon nitride, and the like are also contemplated. It is in top dielectric layer 9 that cavity 4 is formed using well known patterning and etching techniques.

A second wafer 14 is then placed atop top dielectric layer 9. In one embodiment, wafer 14 is a silicon wafer and top dielectric layer 9 is a silicon oxide layer. Fusion bonding is employed to ensure a strong bond between wafer silicon wafer 14 and silicon oxide top dielectric layer 9. As those skilled in the art will appreciate, wafer 14 can be thinned and patterned to form movable elements 2. Electrical contact to MEMS device 1 and/or to components formed in and on wafer 12 can be made through contacts 11. The resulting structure is a MEMS device 1 having a movable element 2 that may be, but is not required to be, formed over a cavity 4, to allow for free movement in at least one axis (the z axis in the case illustrated in FIGS. 1a and 1b).

MEMS device 1 further includes protrusions 16 in cavity 4. Protrusions 16 are designed and positioned such that a movable element 2 will contact one or more of protrusions 16 when the movable element 2 is deflected downward into the cavity, i.e. in the z direction. In FIG. 1a, two cavities 4 are illustrated, each having two protrusions 16. This is a matter of mere design choice and any number of cavities is contemplated, as well as any number and placement of protrusions 16 within the cavity, or elsewhere on MEMS device 1 where movable elements 2 might come in contact with another component of the device, and become stuck thereto.

Protrusions 16 are formed by patterning and removing portions of top dielectric layer 9. This can be accomplished by, e.g., well known photolithography and etching steps. In some embodiments, protrusions 16 have a height sufficient to extend above any sensing electrodes which the movable element might otherwise contact. In one embodiment, the protrusions 16 have a height of about 1,000 Å.

As further illustrated in FIG. 1a, protrusions 16 are coated or covered with a film 18. In an illustrated embodiment, film 18 comprises TiN. An advantageous feature of film 18 is that TiN has a lower surface energy than does silicon oxide. A lower surface energy means less attractive forces will exist between movable elements 2 and film 18 should contact between the two occur, compared to the amount of attractive forces that would exist between movable elements 2 and protrusions 16 if protrusions 16 were not coated with film 18. In illustrative embodiments, protrusion 16 has a water contact angle of higher than about 15°, and in some embodiments protrusion 16 has a water contact angle in the range of about 20° to about 50°. In an illustrative embodiment, film 18 has a thickness ranging from just a few nanometers to tens of nanometers. As a practical matter, it is desirable to have a relatively thin film 18 (the thinner the film, the shorter the deposition time and less the manufacturing costs, for instance). It is sufficient that film 18 provides good coverage of protrusions 16, including at corners, and is thick enough to withstand any mechanical abrasion or deformation that might arise from contact with movable elements 2. In other embodiments, film 18 could comprise AlCu, amorphous Carbon, or a stacked film such as TiN/AlCu, or other semiconductor process compatible and electrically conductive materials.

Figure 2A:
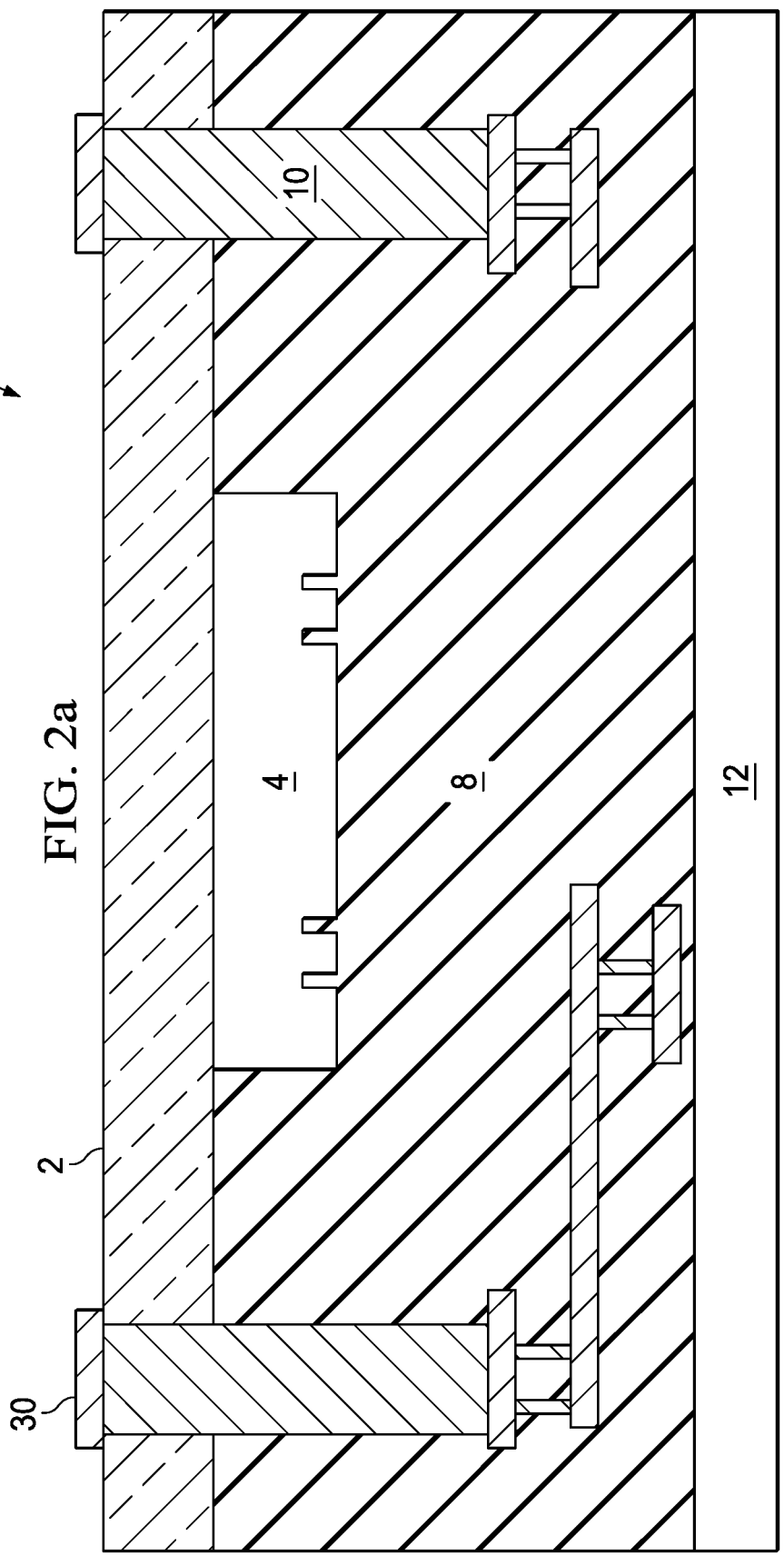
FIGS. 2a and 2b illustrate in cross-sectional view other illustrative embodiment MEMS devices.
Figure 2B:
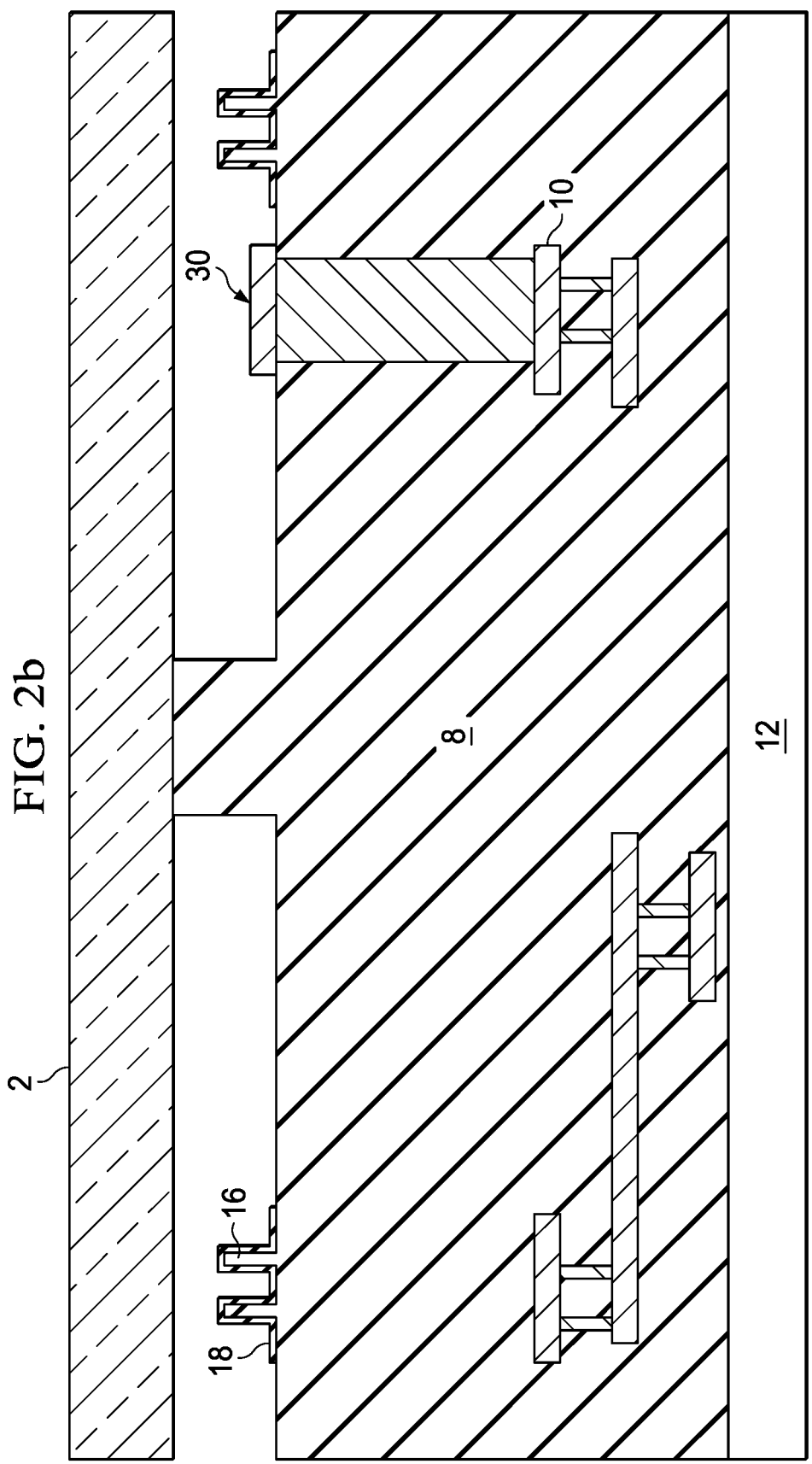

FIG. 2a illustrates another embodiment MEMS device 1, wherein movable element 2 is in the form of a flexible membrane at least partially suspended over cavity 4. Protrusions 16 coated with film 18 are formed on a bottom surface of cavity 4 so that movable element 2 contacts film 18 coated protrusions 16 in the event movable element 2 is deflected downward. In other embodiments. FIG. 2b illustrates yet another embodiment MEMS device, wherein movable element 2 is in the form of a cantilevered beam at least partially suspended over the underlying substrate. As in the previously described embodiments, protrusions 16 are placed and formed such that movable element 2 will contact film 18 when movable element 2 is deflected downward toward the underlying substrate. One skilled in the art will recognize numerous variations and alternative to these illustrated embodiments and will further recognize other placements for film 18 coated protrusions 16 are within the contemplated scope of the present disclosure.

Returning attention now to FIG. 1a, an additional advantageous feature of some embodiments will be discussed. Note that film 18, in addition to covering protrusions 16, also extends over contact 11. Because film 18 is conductive, this means that protrusions 16 are electrically coupled to contact 11. An advantageous feature of this embodiment is that it allows for the potential on protrusions 16 to be controlled. In one illustrative embodiment, protrusions 16 are coupled to a ground potential by way of film 18, contact 11, and interconnects 10. This embodiment allows for charge that might build up on protrusions 16 to be bled off to ground.

Figure 3A:
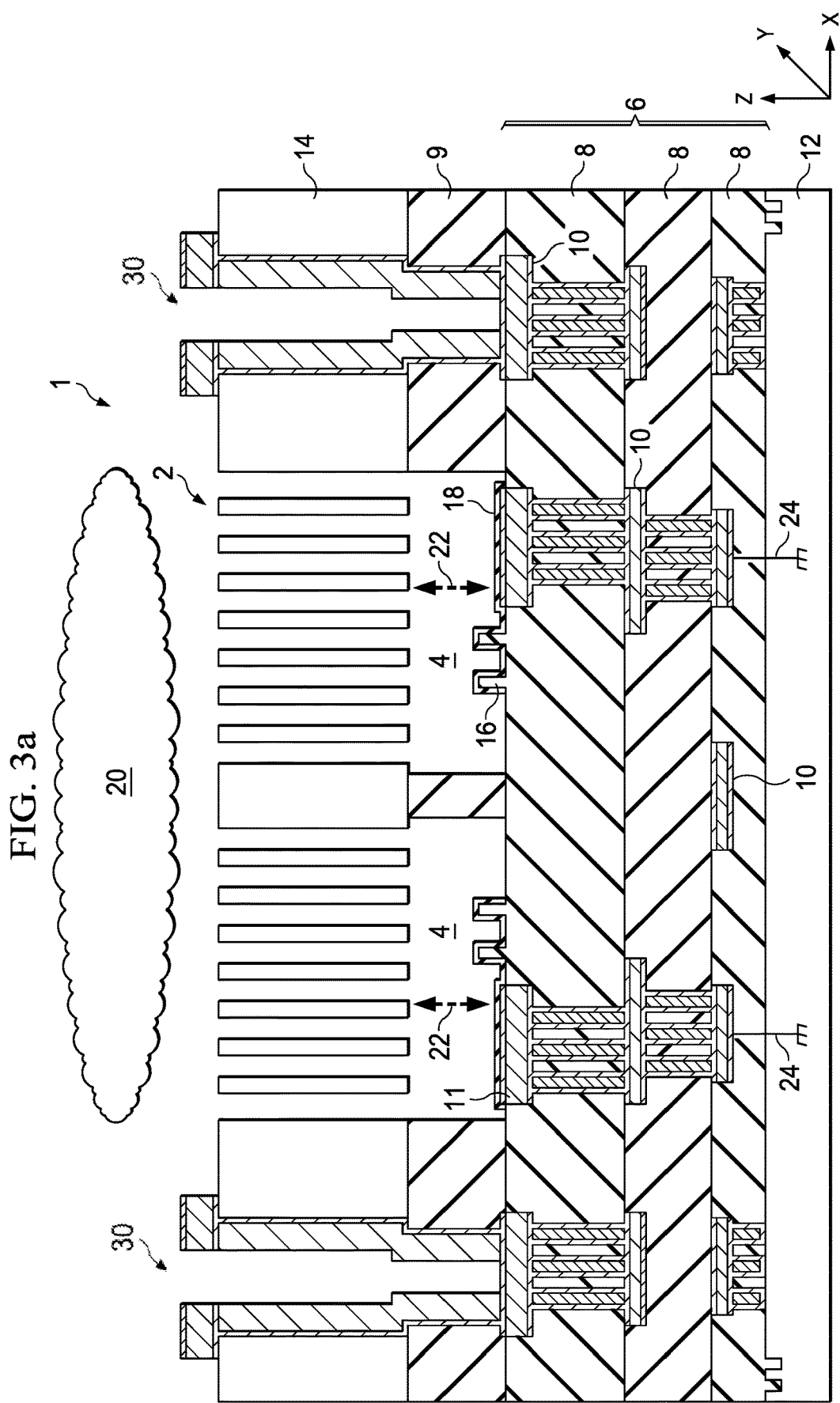

FIG. 3a schematically illustrates conditions during a manufacturing process of MEMS device 1, wherein the device is subjected to a dry process, such as a plasma clean process. The plasma process is schematically illustrated by cloud 20. As is known in the art, a plasma process can cause charge to build up, particularly on conductive surfaces. In the illustrated embodiment, charge might build up on conductive film 18 covering protrusions 16. This charge can cause an electrostatic attraction between film 18 and movable elements 2, schematically illustrated in FIG. 3a by arrows 22. This electrostatic attraction can cause movable elements 2 to deflect downwards toward protrusions 16 and film 18 and become stuck thereto, both by the forces of stiction (i.e. the surface energy of film 18 and movable elements 2 causing them to bond together) as well as electrostatic attraction. This undesirable phenomenon can be reduced or eliminated by electrically coupling protrusion 16 and conductive film 18 to a ground potential 24 by way of contacts 11 and interconnects 10.

Figure 3B:
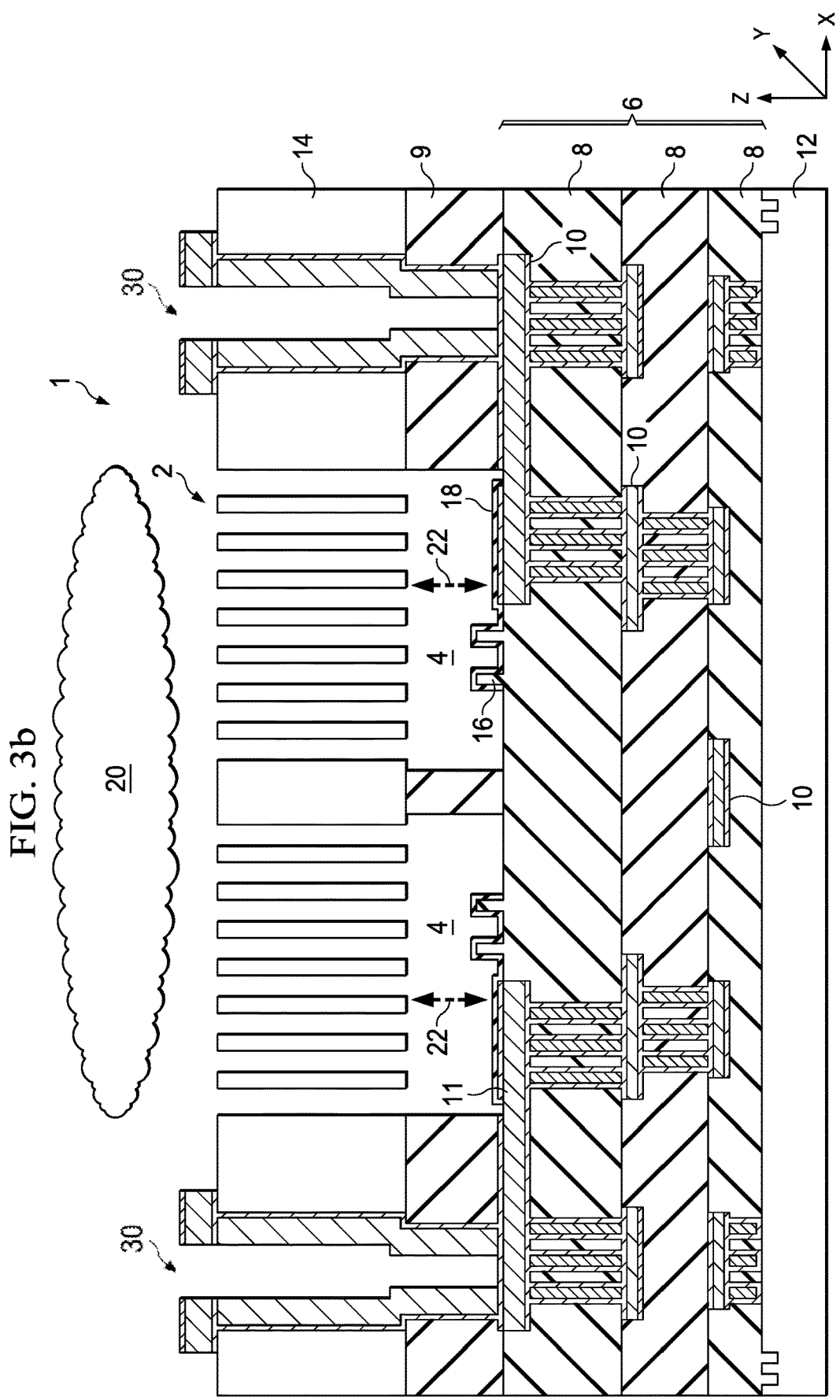

FIG. 3b illustrates yet another embodiment. In this embodiment, contacts 11 do not couple protrusions 16/film 18 to ground. Rather, as illustrated protrusions 16/film 18 are electrically coupled to movable elements 2 by way of contacts 11 and interconnects 10 that electrically connect to vias 30. In this way, protrusions 16/film 18 can be maintained at a potential that is the same as the potential of movable elements 2, thus reducing or eliminating electrostatic attraction between them, and hence reducing or eliminating the likelihood of a movable element becoming stuck to the protrusions.

Various alternative approaches will be apparent to those skilled in the art, informed by the present disclosure. For instance, one could introduce a switching mechanism, whereby protrusions 16/film 18 could be switchably coupled to ground, to the movable element, or to some other potential voltage. Alternatively, some protrusions could be coupled to ground, whereas other protrusions are coupled to other potentials. Whereas film 18 is illustrated as a continuous film covering (and hence electrically coupling) all protrusions within a given cavity, as a matter of design choice, film 18 could be patterned to provide different electrical paths for different protrusions. In yet another embodiment, film 18 could couple one or more protrusions 16 to a potential voltage source (not shown). This potential voltage source could be configured to provide a voltage of the opposite polarity to that voltage on movable elements 2. In this way, protrusions 16 could be configured to have an electrostatic force that repulses movable elements 2 and hence counteracts any electrostatic attraction that otherwise exists or that is induced between movable elements 2 and protrusions 16.

The illustrated embodiments also provide advantageous features during so-called wet processes involving rinse and immersion in liquids such as water, solvents, and the like, as schematically illustrated by reference number 26 in FIG. 3c. Those skilled in the art will recognize that liquid will occupy the spaces, e.g. between movable elements 2 and protrusions 16, as schematically illustrated by reference number 28. Depending upon the liquid and the material from which protrusions 16 and movable elements 2 are comprised, significant attractive forces can be generated by the capillary action of the liquid. Again, by selecting a coating, such as film 18, having a lower surface energy, the attractive force between protrusions 16 and liquid 28 can be reduced, thus lessening the likelihood or severity of movable elements 2 becoming stuck. One commonly employed measure of the attraction between a liquid and a surface is the so-called contact angle, which is related to surface energy. The larger the contact angle, the lower the surface energy-and hence the lower the amount of attraction between the surface and the liquid. As an example, silicon oxides typically have a contact angle in the range of about 0° to about 20°. By contrast, a metal film such as TiN typically has a contact angle ranging from about 20° to about 50°. Hence, the deleterious effects of capillary action and surface tension can be reduced through film 18.

Figure 4A:
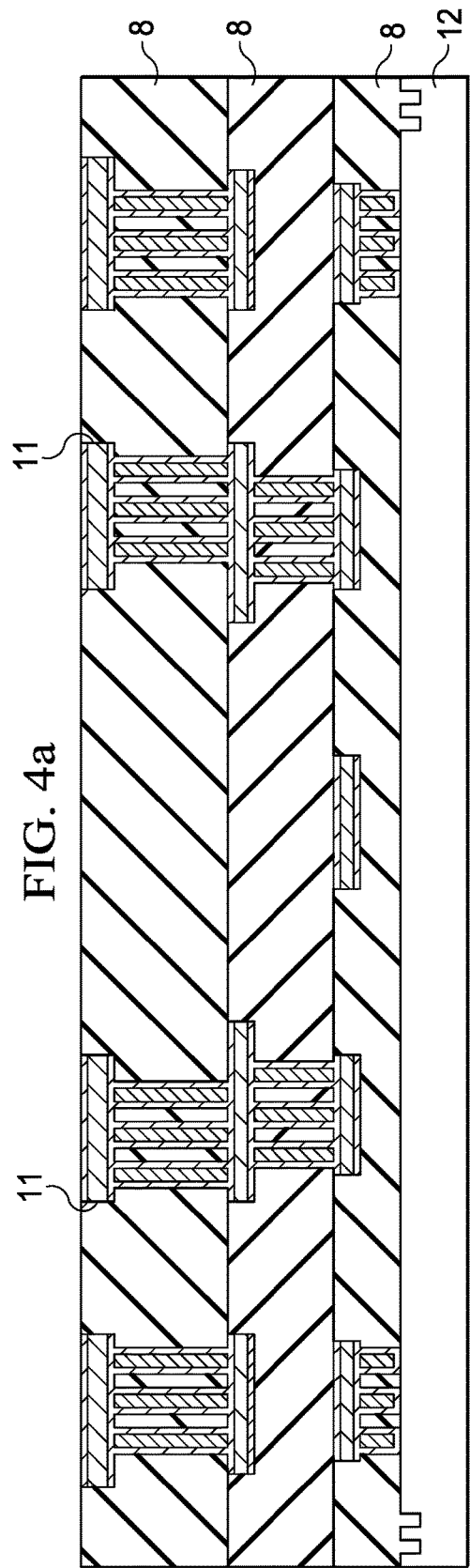

An illustrative method for forming illustrative MEMS device 1 is now presented with reference to FIGS. 4a through 4f. FIG. 4a illustrates an intermediate point in the manufacture of MEMS device 1. As shown, wafer 12 has had formed thereon various dielectric layers 8 in which have been formed interconnects 10 and contacts 11. Interconnects can be formed of copper or a copper alloy, aluminum or an aluminum alloy, doped polysilicon, and or other conductive materials. In one embodiment, a first layer of conductor comprises doped polysilicon and subsequent layers of conductor comprise copper formed using well-known damascene techniques. Dielectric layers may comprise silicon oxide, silicon nitride, various silicon glasses, high k dielectrics, and the like, as are well known in the art. Those skilled in the art will recognize that various etch stop layers, barrier layers, and the like (not shown) will likely be employed in forming the interconnects 10. Although three dielectric layers and interconnect layers are shown, this is for illustration only and is not intended to limit the scope of this disclosure.

Figure 4B:
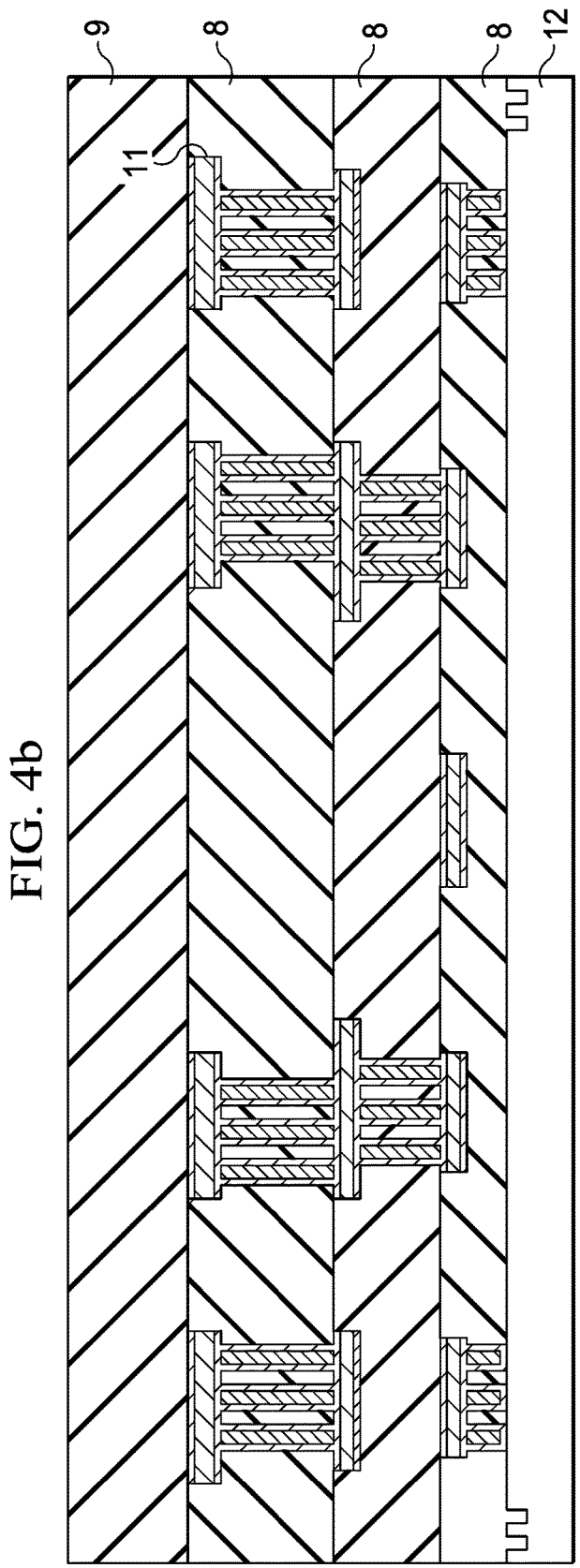

As illustrated in FIG. 4b, a top dielectric layer 9 is formed atop the intermediate workpiece. Top dielectric layer may comprise a material similar to one of dielectric layers 9 or may alternatively comprise one or more passivation layers. In one contemplated embodiment, dielectric layer 9 comprises silicon oxide to provide for good bonding adhesion to MEMS wafer 14 as will be described in detail below.

Figure 4C:
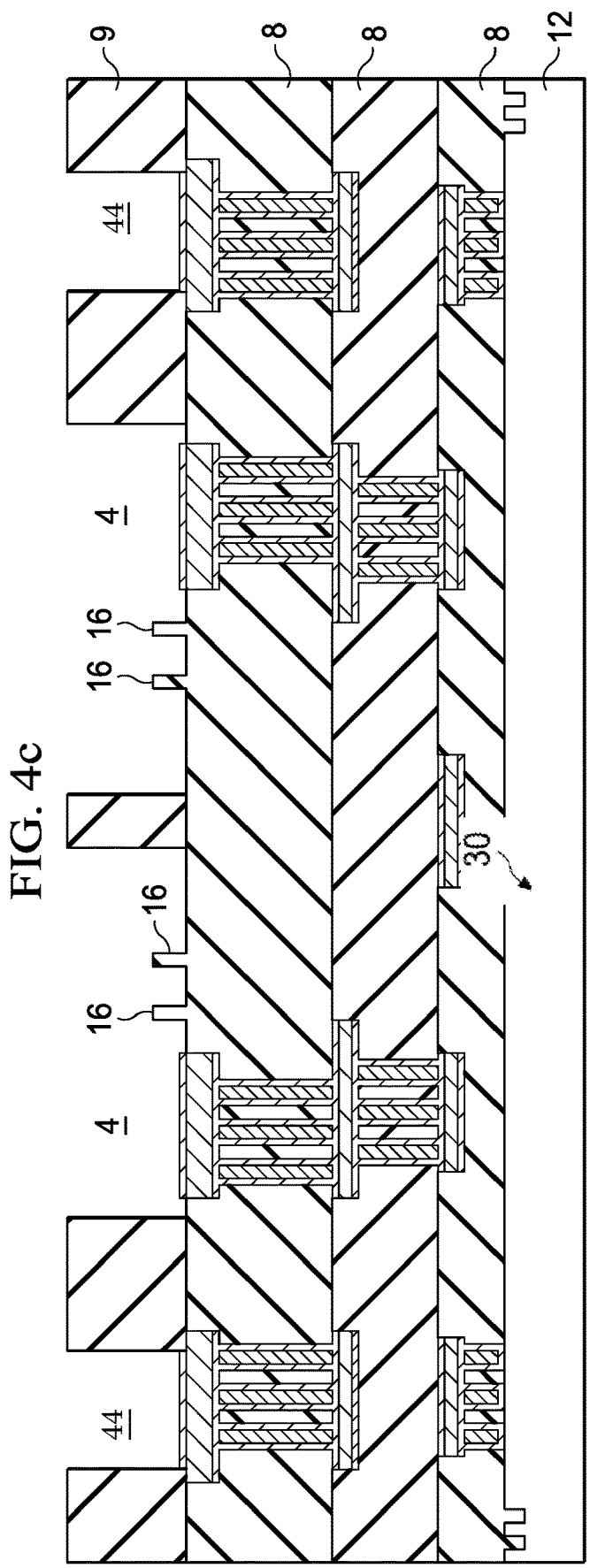

FIG. 4c illustrates the intermediate workpiece after top dielectric layer 9 has been patterned to form cavities 4 (e.g. first cavities), second cavities 44, and also protrusions 16. One skilled in the art will recognize various patterning techniques could be employed to form cavities 4 and 44 and protrusions 16. In one embodiment, a first patterned photomask is used to protect the rest of top dielectric layer 9 while other portions of top dielectric layer 9 are removed to form protrusions 16. A second patterned photomask is then used to protect protrusions 16 while other portions of top dielectric layer are removed to form cavities 4. Alternatively, cavities 4 and protrusions 16 could be formed simultaneously by blanket etching away portions of top dielectric layer 9, followed by additional etching away of selected portions of top dielectric layer 9 to obtain the desired pattern. In yet other embodiments, top dielectric layer is first selectively etched using one or more patterned photomasks, followed by a blanket (e.g. timed or end point detection) etch to complete the pattering process. Regardless of the manufacturing steps employed, the result is a top dielectric layer 9 having cavities 4 formed therein and further having one or more protrusions 16 formed within one or more of cavities 4. Although protrusions 16 are illustrated as being formed only on the bottom of cavities 4, it is within the contemplated scope of the present disclosure that protrusions could be formed on sidewalls of cavities 4 and or on a top surface of top dielectric layer 9.

Figure 4D:
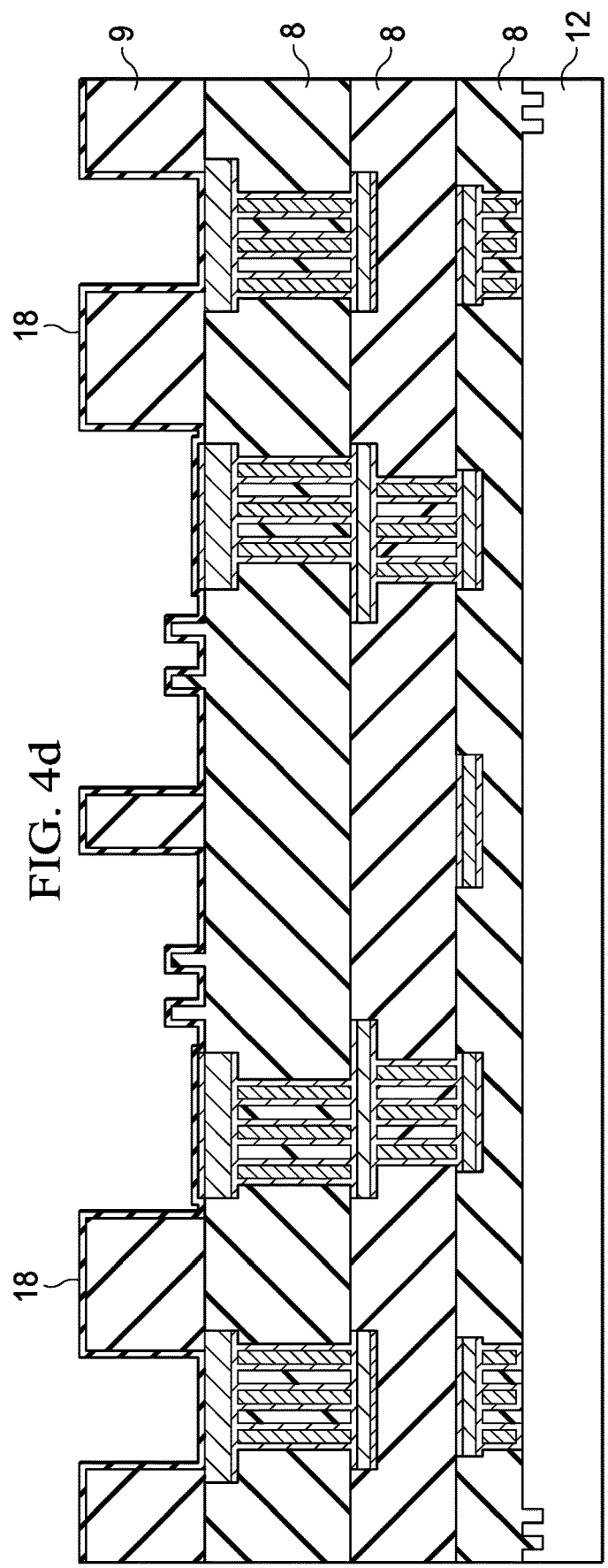
Figure 4E:
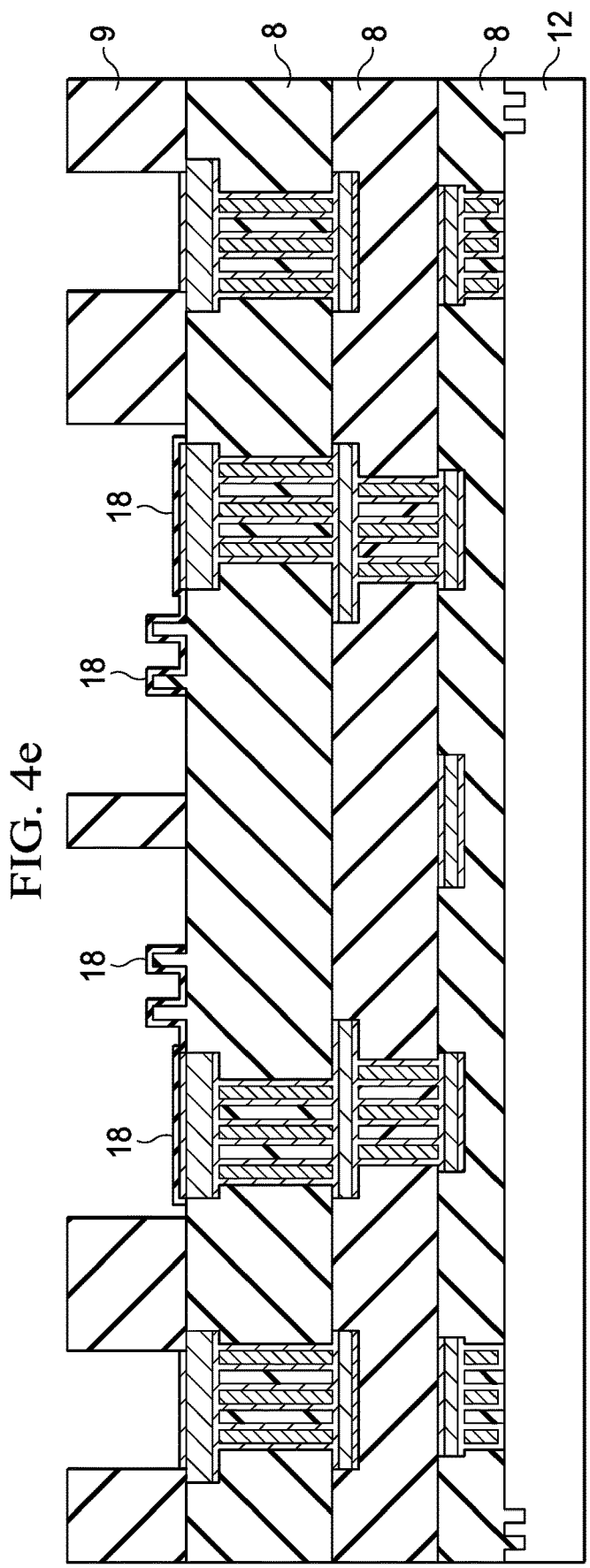

As illustrated in FIG. 4d, film 18 is next formed over the workpiece, including over protrusions 16. Film 18 may be TiN, or some other appropriate material and may be deposited using CVD (PECVD, etc.), PVD (sputter, evaporation, etc.), ALD, or the like, and/or a combination thereof to a thickness of perhaps 5 to 10 nanometers.

Film 18 is next patterned using photolithography and etching techniques to remove film 18 from much of the workpiece, but leaving film 18 coating protrusions 16. In the illustrated embodiments, film 18 also extends over to and covers contacts 11, thus electrically coupling one or more protrusions 16 to one or more contacts 11. As addressed above, in this way protrusions 16 can be electrically coupled to a desired voltage potential. In other embodiments, film 18 can be deposited or otherwise formed over protrusions 16.

Manufacture of the MEMS device continues with the process illustrated in FIG. 4f. A MEMS wafer 14 is placed atop patterned top dielectric layer 9. As addressed above, top dielectric layer 9 and wafer 14 may be selected such that the two materials form a strong bond when placed in contact. Pressure and or heat may be applied to improve or expedite the bonding process. Either before or after MEMS wafer 14 is bonded to top dielectric layer 9, MEMS wafer 14 is processed, e.g., thinned and patterned, to form movable elements 2. Various components and electrical connections may be formed in and on wafer 14. For instance, if wafer 14 is a semiconductor material, such as silicon, various transistors and other devices (not shown) can be formed in and on wafer 14. Likewise, various interconnects can be formed in and on wafer 14. As but one example, FIG. 4f illustrates vias 30 that are formed extending through wafer 14. In the illustrated embodiments, these vias 30 are aligned with interconnects 10. This allows for electrical coupling of movable elements 2 and or other components on wafer 14 to components on wafer 12. Note that, due to the size of its cross sectional area, each via 30 is illustrated as having a central void region. This is for illustration only, and vias 30 that are completely filled with a conductor are within the contemplated scope of the present disclosure. In some embodiments, via 30 comprises a through silicon via (TSV).

Figure 5:
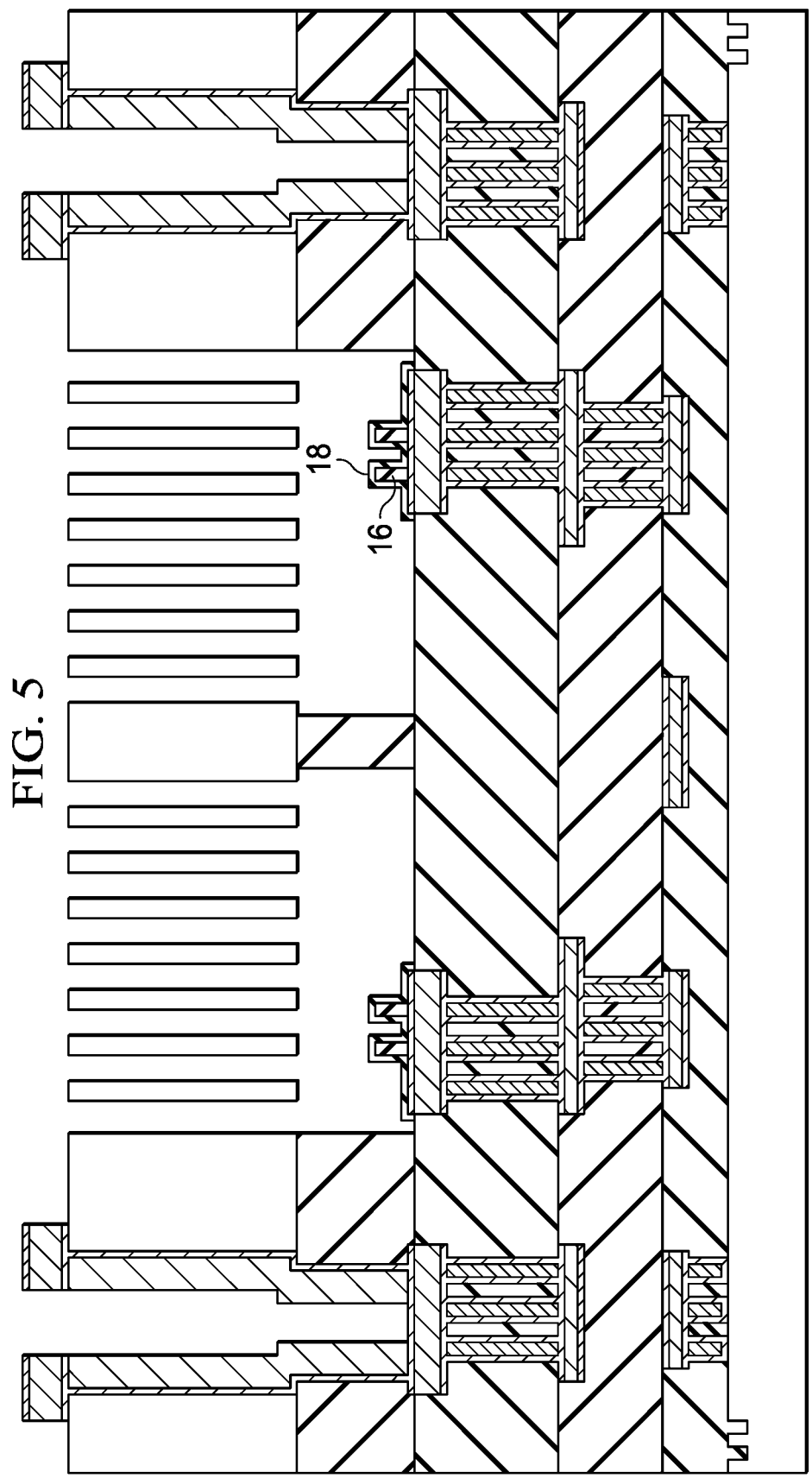
FIG. 5 illustrates another embodiment MEMS device.

FIG. 5 illustrates an alternate embodiment. In this embodiment, protrusions 16 are formed directly overlying contacts 11. Film 18 is formed directly overlying protrusions 16 and contacts 11. This embodiment can be obtained using the processes described above with respect to FIGS. 4a through 4f, albeit with a different photomask pattern to align protrusions 16 with previously formed contacts 11.

FIG. 6 illustrates yet another embodiment MEMS structure 1. Details regarding this embodiment that are similar to those for the previously described embodiments will not be repeated herein. In this embodiment, protrusions 17 are formed from metal interconnect materials, similar to the materials used in the formation of interconnects 10 and contacts 11. In some embodiments, protrusions 17 may be formed of a copper alloy. In other embodiments, protrusions 17 may be formed of a copper alloy which is further coated with TiN or another material selected to have desirable properties, such as a low surface energy value. Because the surface area of protrusions 17 is lower than the surface area of the floor of cavity 4 and further because protrusions 17 have a lower surface energy than does the silicon oxide material of the floor of cavity 4, protrusions 17 have less attraction to movable elements 2 and are less likely to stick when placed in contact with movable elements 2.

FIGS. 7a through 7e illustrate an illustrative method for forming the MEMS device illustrated in FIG. 6. Starting with FIG. 7a, an intermediate step in the manufacturing process is illustrated in which various interconnects 10 have been formed in stacked dielectric layers 8 atop substrate 12, as has been previously described. In the illustrated process step, a stack of metal layer 32 and metal layer 33 has been blanket formed (e.g., deposited) over the workpiece. Layer 32 is the metal layer from which contacts 11 will subsequently be formed, as described below. In some embodiments, layer 32 is copper that is blanket deposited over the workpiece including within trenches (not shown) formed within the topmost of the stacked dielectric layers, in what is commonly referred to as a damascene process. Layer 33 is the layer from which protrusions 17 will be formed as also described below. In some embodiments, layer 33 is TiN, although other materials are also contemplated, as discussed above.

Figure 7A:
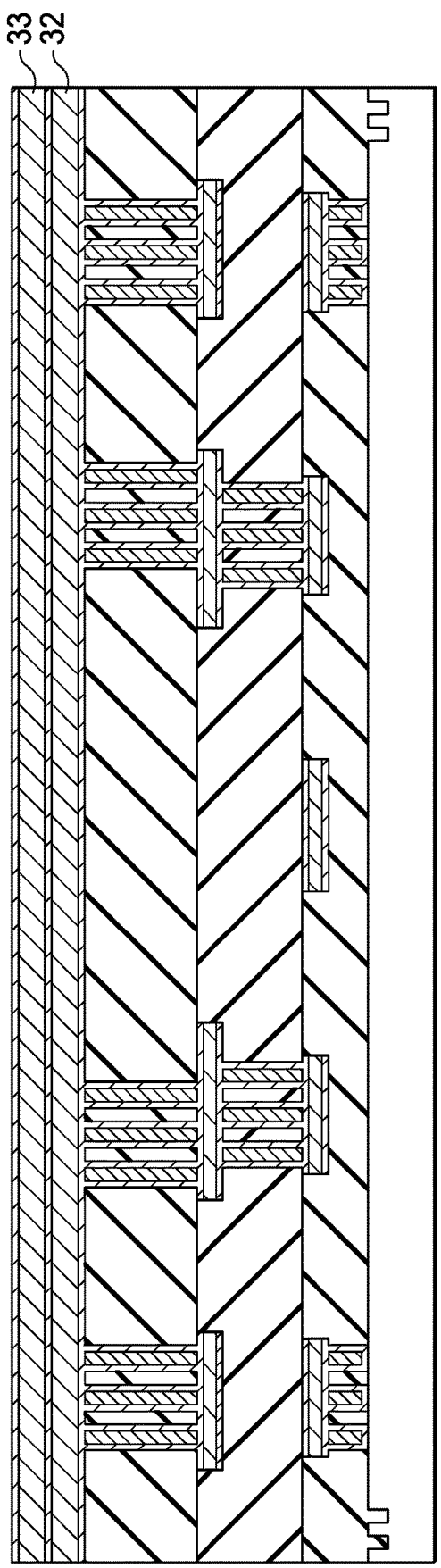
Figure 7B:
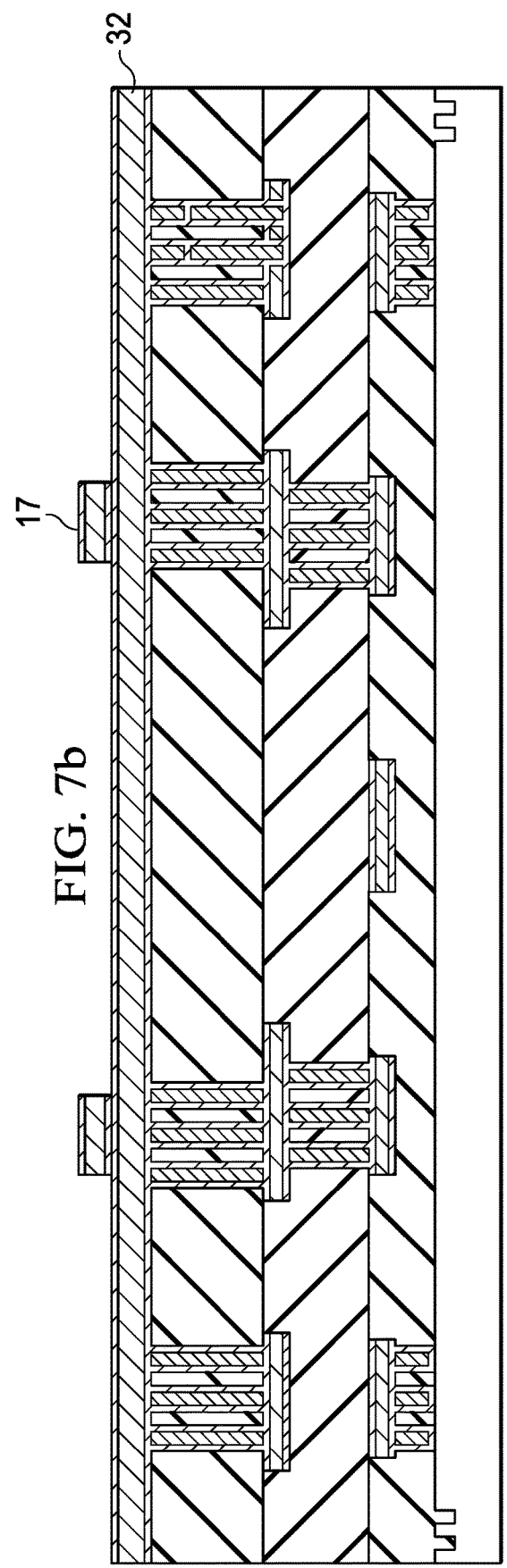
Figure 7C:
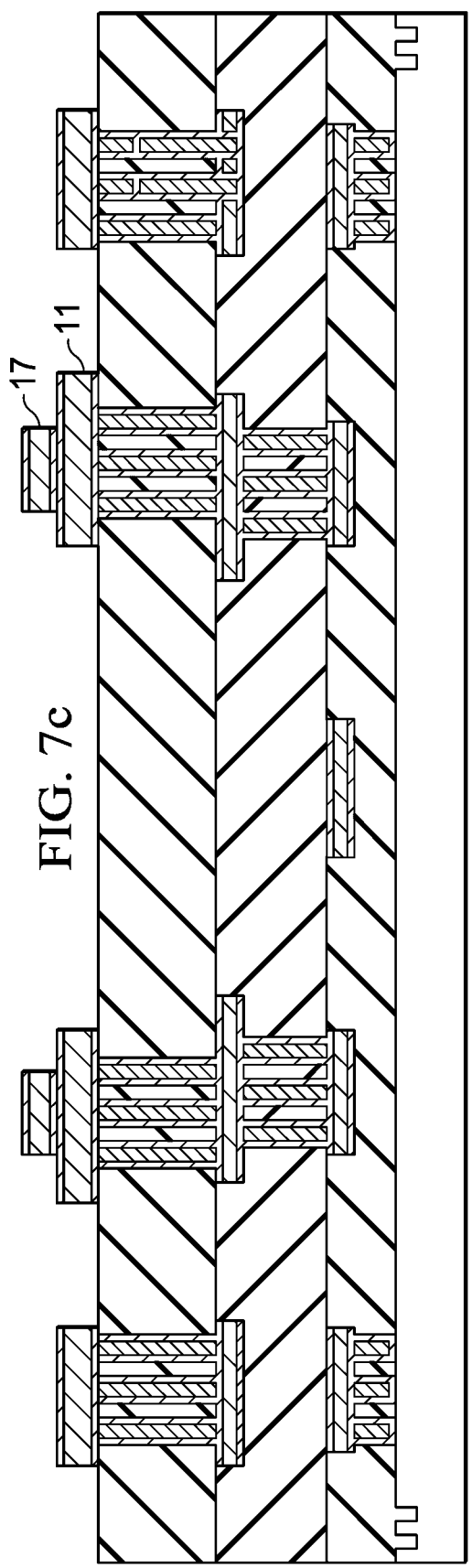

Next, as illustrated by FIG. 7b, layer 33 is patterned using known photolithography and etching techniques to form protrusions 17. Layer 32 is then patterned using similar techniques to form contacts 11 as illustrated by FIG. 7c.

Processing then continues, as shown in FIG. 7d, with the formation and patterning of top dielectric layer 9 to form cavities 4. Note that the patterning of top dielectric layer 9 is simpler in this embodiment, as it is not necessary to use extra masking steps to form protrusions 16—although extra steps may be required during the formation and patterning of metal layer 33 to form protrusions 17.

Continuing with FIG. 7e, a MEMS wafer 14 is bonded or otherwise attached to the workpiece, which wafer 14 is patterned and thinned to form, e.g., movable elements 2. In the illustrated embodiment, movable element 2 is in the form of a comb structure at least partially suspended over cavity 4. Other movable elements such as those disclosed above could also be employed in this embodiment. Likewise, the number and placement of protrusions 17 are for illustration only. Other numbers and placements of protrusions 17 are within the contemplated scope of the present disclosure.

FIG. 8 illustrates an embodiment MEMS device 1 wherein protrusions 19 are formed from metal layer 32, from which contacts 11 are also formed. In this illustrated embodiment, a single structure 19 performs the functions of both providing a protrusion having a low surface energy and also connecting the protrusion to other circuitry and voltage potentials via interconnects 10. Also shown in FIG. 8 is a sense electrode 34 located beneath movable element 2. Such sense electrodes are frequently employed with MEMS devices and, although not shown, any one of the above described embodiments might also include a sense electrode located adjacent movable element 2. It should be noted that generally it is desirable that movable element 2 not contact sense electrode 34—either during operation or during manufacture. In some embodiments, protrusions 16 or 17 or 19 are specifically arranged such that movable element 2 will contact protrusions 16 or 17 or 19 prior to (and hence be prevented from) contacting sense electrode 34. To this end, protrusion 16 or 17 or 19 may be positioned such that it is within the arc of movement of movable element 2 prior to sense electrode 34. This arrangement is illustrated, for instance, in FIGS. 8 and 8a (a plan view of the area of interest of FIG. 8). As shown, when protrusion 16 is of a same height as sense electrode 34, advantageous features can still be obtained by positioning protrusion 16 such that movable element will contact protrusion 19 prior to making contact with sense electrode 34. One skilled in the art will recognize that protrusion 19 could be made higher than sense electrode 34 in other embodiments.

Generally speaking embodiments include microelectromechanical system (MEMS) device having a substrate and a movable element at least partially suspended above the substrate and having at least one degree of freedom. A protrusion extends from the substrate and is configured to contact the movable element when the movable element moves in the at least one degree of freedom. The protrusion comprises a surface having a low surface energy relative a silicon oxide surface.

Other embodiments provide for a MEMS device having a first substrate with a plurality of interconnect layers embedded in a respective plurality of stacked dielectric layers. A second substrate is mounted atop the first substrate and bonded to a topmost one of the dielectric layers. The second substrate comprises a movable element at least partially suspended above the first substrate. A protrusion extends from the first substrate and is configured so as to engage the movable element when the movable element is deflected. The protrusion comprises a conductive element electrically coupled to one of the interconnect layers.

Some aspects of the present disclosure relate to a method of forming a MEMS device. The method includes forming an interconnect layer on a first substrate and forming a dielectric layer over the interconnect layer. A protrusion is formed on a top surface of the dielectric layer, the protrusion having a low surface energy relative the surface energy of the dielectric layer. The method further includes forming an electrical path between the protrusion and a voltage potential node. The method yet further includes bonding a MEMS wafer to the dielectric layer, and patterning the MEMS wafer to form a movable element. The protrusion is in a path of movement of the movable element when the movable element is deflected in a first direction.

One general aspect of embodiments disclosed herein includes a microelectromechanical system (MEMS) device including: a substrate; a movable element at least partially suspended above the substrate and having at least one degree of freedom; and a protrusion extending from the substrate and configured to contact the movable element when the movable element moves in the at least one degree of freedom, where the protrusion includes a surface having a water contact angle of higher than about 15° measured in air.

Another general aspect of embodiments disclosed herein includes a method of forming a mems device, the method including: forming in a substrate a cavity; forming extending a floor of the cavity a protrusion, the protrusion having a surface having a water contact angle of higher than about 15° measured in air; and suspending above the cavity a movable element, the movable element having at least one degree of freedom and configured to contact the protrusion when moved in the one degree of freedom direction.

Yet another general aspect of embodiments disclosed herein includes a microelectromechanical system (MEMS) device including: a first substrate; a plurality of dielectric layers atop the first substrate, a topmost of the plurality of dielectric layers including a bonding layer having a top surface and having a cavity formed therein; a plurality of interconnect layers embedded in respective ones of the plurality of dielectric layers; a second substrate bonded to the bonding layer; a movable element formed at least in part in the second substrate and having at least one degree of freedom defining a motion path; a protrusion extending from a floor of the cavity and located in the motion path of the movable element, the protrusion having a surface having a water contact angle of higher than about 15° measured in air; and an electrical path between the protrusion and at least one of the interconnect layers.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A MEMS device, comprising:
a first substrate;
a plurality of dielectric layers over the first substrate, wherein a topmost layer of the plurality of dielectric layers has a cavity formed therein;
a second substrate, the second substrate comprising a movable element at least partially suspended above the cavity, the movable element having at least one degree of freedom, the second substrate bonded to the topmost layer of the plurality of dielectric layers; and
a protrusion extending upwards from a floor of the cavity, the protrusion being in a motion path of the at least one degree of freedom of the movable element, the protrusion comprising:
a dielectric material; and
an electrically conductive film having a first portion and a second portion, the first portion extending along an upper surface of the dielectric material, the second portion extending along sidewalls of the dielectric material, wherein the electrically conductive film is in physical contact with an entirety of a sidewall of the dielectric material, wherein the electrically conductive film has a lower surface energy than a surface energy of the dielectric material.

2. The MEMS device of claim 1, further comprising a plurality of interconnect layers embedded in the plurality of dielectric layers, wherein the plurality of interconnect layers comprise copper.

3. The MEMS device of claim 1, wherein the topmost layer of the plurality of dielectric layers comprises silicon oxide, and the dielectric material comprises silicon oxide.

4. The MEMS device of claim 1, wherein the electrically conductive film comprises TiN.

5. The MEMS device of claim 1, wherein an attractive force between the movable element and the electrically conductive film is less than an attractive force between the movable element and the dielectric material.

6. The MEMS device of claim 1, wherein the movable element includes a membrane, a cantilever beam, or a comb structure.

7. The MEMS device of claim 1, wherein the protrusion is electrically coupled to the movable element.

8. The MEMS device of claim 1, further comprising a switching mechanism that switchably couples the protrusion electrically to a ground potential node or a potential voltage node.

9. The MEMS device of claim 8, wherein the protrusion is coupled to a potential voltage node that provides a voltage of an opposite polarity to that of a voltage on the movable element.

10. A MEMS device, comprising:
a substrate comprising a plurality of interconnect layers embedded in a plurality of stacked dielectric layers;
a series of interdigitated fingers, wherein each of the series of interdigitated fingers is fixed at one end and is free at another end, free ends of the series of interdigitated fingers extend over a cavity formed in the substrate; and
a protrusion extending upwards from a floor of the cavity, the protrusion comprising a conductive film electrically connected to a first interconnect layer of the plurality of interconnect layers, wherein a first interdigitated finger of the series of interdigitated fingers contacts the protrusion when the series of interdigitated fingers are deflected downwards towards the floor of the cavity; and
a switching mechanism that switchably couples the protrusion electrically to a ground potential node or a potential voltage node.

11. The MEMS device of claim 10, wherein the series of interdigitated fingers comprise silicon.

12. The MEMS device of claim 10, further comprising a sense electrode, wherein a top surface of the protrusion is at a higher level than a top surface of the sense electrode.

13. The MEMS device of claim 10, wherein the conductive film comprises a material with a surface having a water contact angle of higher than about 15° measured in air.

14. The MEMS device of claim 10, wherein the protrusion comprises:
a metal having a same material composition as the plurality of interconnect layers; and
a film comprising a material selected from a group consisting essentially of TiN, AlCu, amorphous Carbon, a stacked film of TiN/AlCu, and combinations thereof, the film extends over an upper surface and sidewalls of the metal.

15. The MEMS device of claim 10, further comprising a contact on the floor of the cavity, wherein the protrusion directly overlies the contact.

16. A MEMS device comprising:
a plurality of dielectric layers atop a first substrate;
a second substrate bonded to a topmost layer of the plurality of dielectric layers, the second substrate comprising a plurality of movable elements, each of the plurality of movable elements having a fixed end that is fixed and a free end that is free, wherein the free end of each of the plurality of movable elements is configured to deflect downward into a cavity in the topmost layer of the plurality of dielectric layers; and
a protrusion extending upwards from a floor of the cavity, the protrusion configured to contact at least one of the plurality of movable elements when the plurality of movable elements are deflected downward into the cavity, wherein the protrusion comprises:

a first dielectric layer, a material of the first dielectric layer and a material of the topmost layer of the plurality of dielectric layers being the same; and an electrically conductive film contacting a top surface and a sidewall of the first dielectric layer, the electrically conductive film comprising a material having a water contact angle in a range from 20° to 50° and a switching mechanism that switchably couples the first dielectric layer and the electrically conductive film to either a ground potential node or a potential voltage node.

17. The MEMS device of claim 16 further comprising a plurality of interconnect layers embedded in the plurality of dielectric layers.

18. The MEMS device of claim 16, wherein a material of the protrusion has a lower surface energy than a surface energy of the material of the topmost layer of the plurality of dielectric layers.

19. The MEMS device of claim 18, wherein the material of the topmost layer of the plurality of dielectric layers comprises silicon oxide and the material of the electrically conductive film comprises TiN.

20. The MEMS device of claim 16, wherein the plurality of movable elements comprises a series of fingers in a comb structure.

* * * * *